United States Patent [19]
Ryu et al.

[11] Patent Number: 5,946,225
[45] Date of Patent: Aug. 31, 1999

[54] SRAM DEVICE HAVING NEGATIVE VOLTAGE GENERATOR FOR PERFORMING STABLE DATA LATCH OPERATION

[75] Inventors: Douk Hyoun Ryu; Yong Chul Cho; In Hwan Eum, all of Kyoungki-do, Rep. of Korea

[73] Assignee: Hyundai Electronics Industries Co., Ltd., Rep. of Korea

[21] Appl. No.: 09/075,049

[22] Filed: May 8, 1998

[30] Foreign Application Priority Data

May 8, 1997 [KR]  Rep. of Korea ................. 97-17728

[51] Int. Cl.$^6$ ................................................. G11C 11/00
[52] U.S. Cl. ........................... 365/154; 365/156; 365/226; 365/233.5
[58] Field of Search ..................... 365/154, 156, 365/226, 233.5

[56] References Cited

U.S. PATENT DOCUMENTS

| | | | |
|---|---|---|---|
| 4,984,207 | 1/1991 | Tateno et al. | 365/208 |
| 5,406,513 | 4/1995 | Canaris et al. | 365/154 |
| 5,528,536 | 6/1996 | Baldi et al. | 365/226 |
| 5,696,728 | 12/1997 | Yu et al. | 365/226 |
| 5,696,731 | 12/1997 | Miyamoto | 365/233.5 |
| 5,715,191 | 2/1998 | Yamauchi et al. | 365/154 |
| 5,757,702 | 5/1998 | Iwata et al. | 365/154 |

*Primary Examiner*—Son T. Dinh
*Attorney, Agent, or Firm*—Blakely Sokoloff Taylor & Zafman

[57] ABSTRACT

A SRAM device according to the present invention performs a stable data latch operation. The present invention provides a negative voltage generator which is coupled to the drive transistors in the SRAM device for providing negative voltage for the drive transistors during a read cycle of the SRAM device when a word line of the SRAM device is activated. The negative voltage generator includes an output terminal coupled to access transistors, a current path for discharging the output terminal up to a ground voltage level in response to control signals, and a pump for pumping the output terminal to make the output terminal be in a negative voltage level.

11 Claims, 12 Drawing Sheets

SRAM DEVICE HAVING NEGATIVE VOLTAGE GENERATOR FOR PERFORMING STABLE DATA LATCH OPERATION

BACKGROUND OF THE INVENTION

1. Field of the Invention

The present invention relates to an apparatus for driving SRAM cell, and more particularly to techniques which effectively drive the SRAM with a stable data latch operation.

2. Description of Related Art

Referring to FIG. 1 in which a conventional SRAM cell is shown, source terminals of drive transistors 101 and 102 are connected to a ground voltage level GND, and drains thereof are respectively connected to cell nodes N1 and N2 in which data is stored. Accesses transistors 111 and 112 are formed between bit lines BIT and /BIT and the cell nodes N1 and N2, respectively, such that they access the stored data in response to control signals on a word line WL. PMOS transistors 121 and 122 connected to the nodes N1 and N2 act as high load resistors.

However, the conventional SRAM cell has drawbacks in that an unstable voltage change can be caused by a bit line precharge while the access transistors 111 and 121 coupled to the word line WL are turned on. Because the bit lines BIT and /BIT are precharged up to a given voltage level (power supply), positive charges on the bit lines can be introduced to the cell nodes N1 and N2 during the bit line enable and this charge transfer between the bit lines and cell nodes may increase the voltage level of the cell nodes N1 and N2.

On the other hand, in the case where the power supply is low, the high node of the nodes N1 and N2 may be in a relatively low voltage level. For example, assuming that the power supply is in a relatively low voltage level and the node N1 must be in relatively high voltage level, this low power supply makes the voltage level of the cell node N1 relatively low. This low voltage level in the cell node N1 makes the current of the drive transistor 102 decreased. Also, the decreased current of the drive transistor 102 increases the voltage of the node N2 and the increased voltage of the node N2 weakly turn on the drive transistor 101. As a result, the high cell node N1 can not be kept its voltage level high. Accordingly, the voltage difference between the nodes N1 and N2 is decreased. Further, at a low temperature, because of the increase of the threshold voltage of the drive transistors, this low-voltage difference is getting more serious. At this low power supply, since the voltage difference between the nodes N1 and N2 is low, the memory cell is sensitive to a noise and the cell current is decreased, so that the memory cell operation may be unstable and the time the cell data is read out on the bit line is delayed.

FIGS. 2A and 2B are plots illustrating the transient voltage analysis in the SRAM of FIG. 1. In particular, FIG. 2A is a simulation plot in the case where the power supply is 2.5 V and FIG. 2B is a simulation plot in the case where the power supply is 2.0 V. Referring to FIGS. 2A and 2B, the voltage difference between the nodes N1 and N2 is 1.31 V and 0.45 V at the power supply 2.5 V and 2 V, respectively. That is, the lower the power supply is, the lower the voltage difference is.

With the decreasing trend of the power supply, for example, from 5 V to 3.3 V or 3.3 V to 2.2 V, the conventional SRAM has a problem in that the cell data latch is unstable.

SUMMARY OF THE INVENTION

An object of the present invention is to provide an apparatus for driving SRAM cell with a stable data latch operation in low power supply.

In accordance with an aspect of the present invention, there is provided a SRAM device including access transistors and drive transistors, comprising: a negative voltage generator coupled to the drive transistors for providing negative voltage for the drive transistors during a read cycle of the SRAM device, wherein a word line of the SRAM device is activated for the read cycle.

In accordance with another aspect of the present invention, there is provided a SRAM device including access transistors and drive transistors, comprising: a negative voltage generator coupled to sources of the drive transistors, to a first well on which the drive transistors are formed and to a second well on which the drive transistors are formed, for providing negative voltage for the sources of the drive transistors and the first and second wells during a read cycle of the SRAM device when a word line of the SRAM device is activated.

BRIEF DESCRIPTION OF THE DRAWINGS

Other objects and aspects of the invention will become apparent from the following description of the embodiments with reference to the accompanying drawings, in which.

DETAILED DESCRIPTION OF THE PREFERRED EMBODIMENTS

Hereinafter, the SRAM cell according to the present invention will be described in detail referring to the accompanying drawings.

Figure 1:
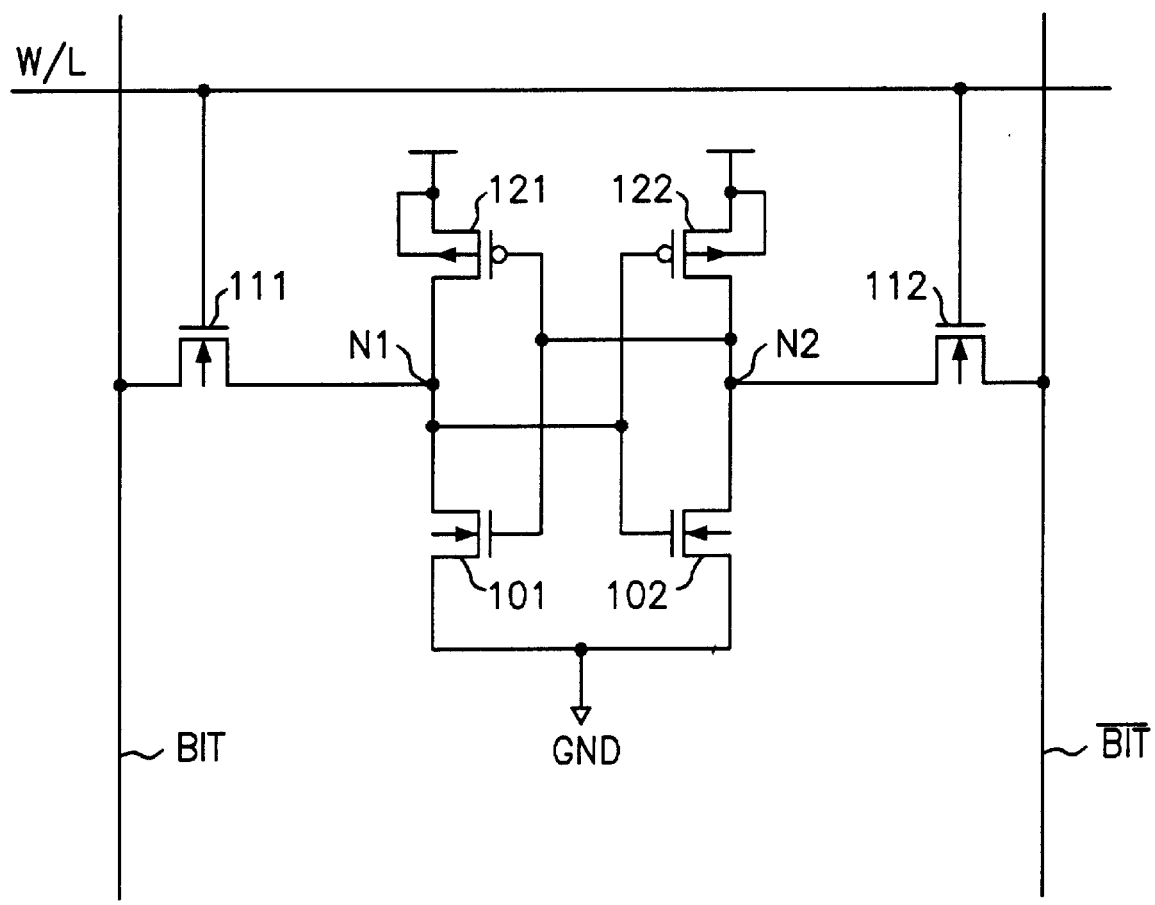
FIG. 1 is a circuit diagram illustrating a convectional SRAM cell.
Figure 3:
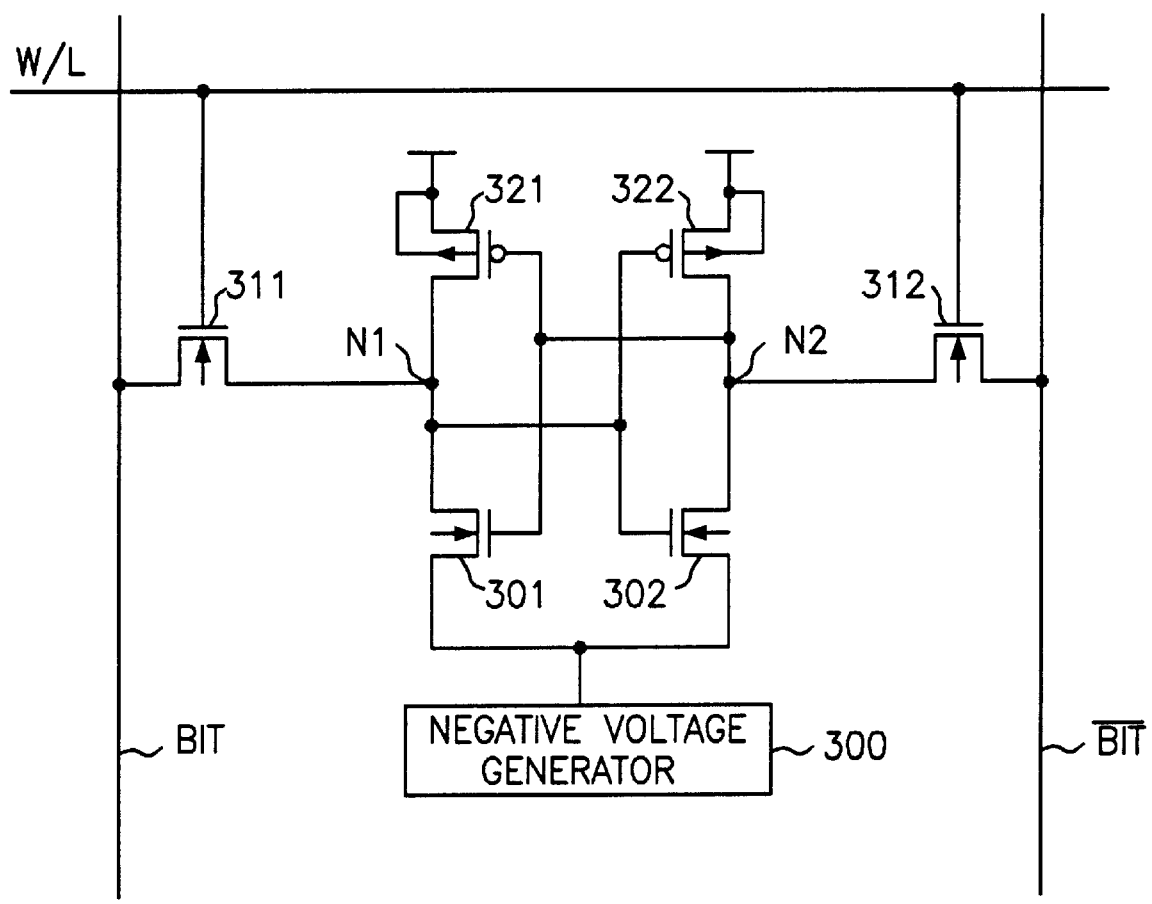
FIG. 3 is a circuit diagram illustrating a SRAM cell in accordance with an embodiment of the present invention.

First, referring to FIG. 3, there is shown a circuit diagram illustrating a SRAM cell in accordance with an embodiment of the present invention. The reference numerals 301 and 302 denote drive transistors, 321 and 322 denote load transistors, 311 and 312 denote access transistors, and 300 denotes a negative voltage generator. On the contrary to the conventional SRAM cell as shown in FIG. 1, sources of drive transistors 301 and 302 are not coupled to a ground voltage level, but coupled to the negative voltage generator 300. The negative voltage generator 300 supplies negative voltage for the sources of drive transistors 301 and 302 during the read cycle in which a word line WL is activated. During other cycles except for the read cycle, the negative voltage generator 300 acts as a ground voltage level.

Figure 4:
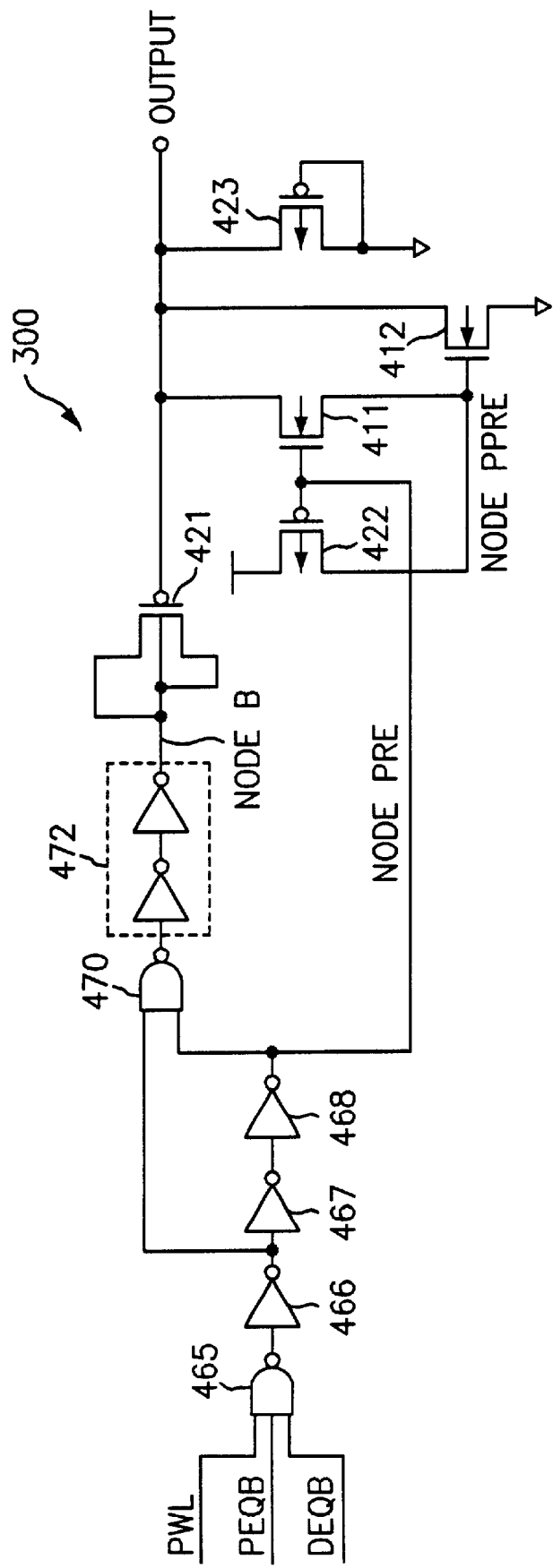
FIG. 4 is a circuit diagram illustrating a negative voltage generator used in the SRAM cell of FIG. 3.
Figure 5:
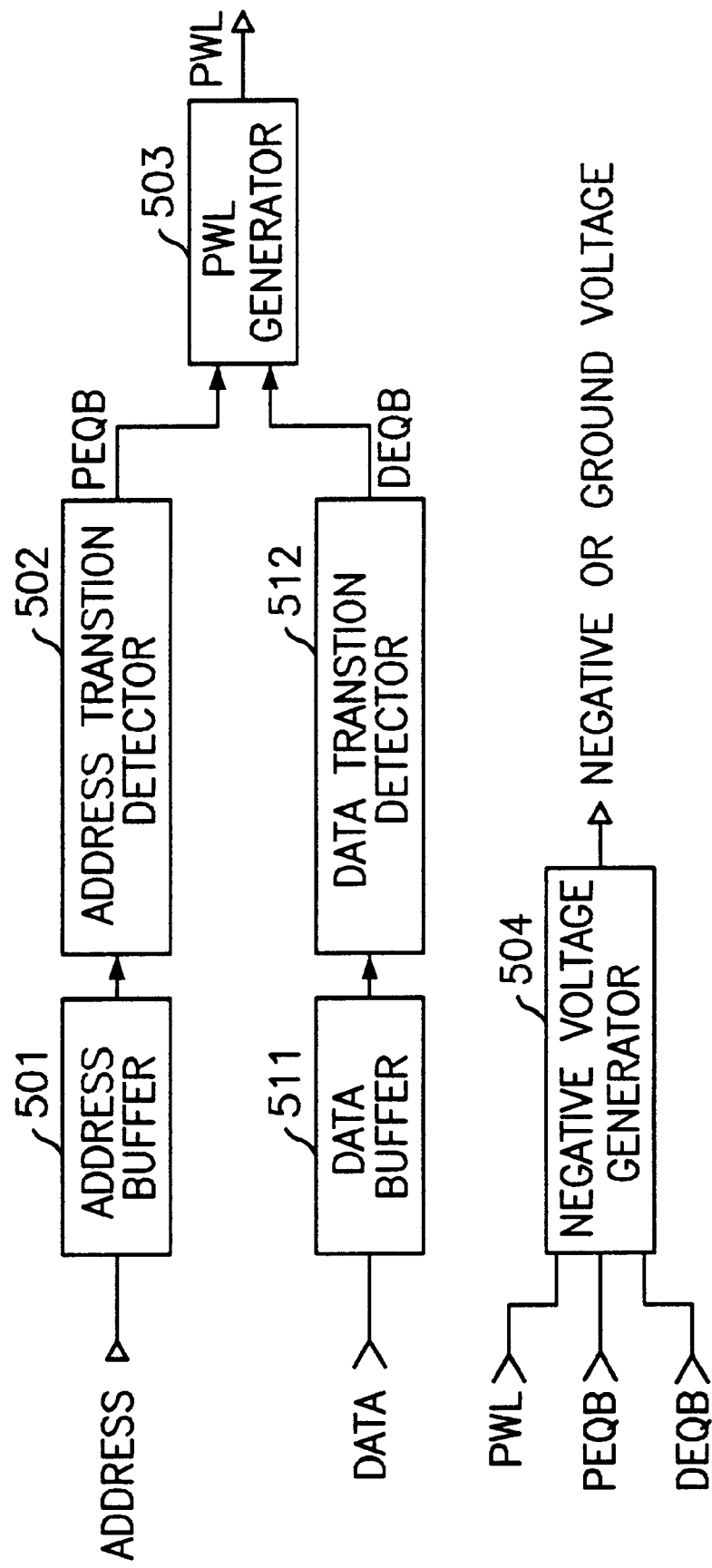
FIG. 5 is a block diagram illustrating generation of input signals which are input into the negative voltage generator of FIG. 4.

The detailed configuration of the negative voltage generator 300 is shown in FIG. 4. As shown in FIG. 4, the negative voltage generator 300 carries out the above-mentioned operation, by receiving three control signals, PEQB, DEQB and PWL, which have been used in SRAM devices. To provide negative voltage for the sources of the drive transistors 301 and 302 during the read cycle, it is necessary to adjust the timing to the read cycle. This timing adjustment is achieved by an address transition detector 502 and a data transition detector 512, as shown in FIG. 5.

The control signal PEQB is produced by the address transition detector 502 detecting the address transition. The address transition detector 502 receives the output of an address buffer 501 buffering input address. Similarly, the control signal DEQB is produced by the data transition detector 512 detecting the data transition. The data transition detector 512 receives the output of a data buffer 511 buffering input data. A pulsed word line generator 503 produces a pulsed word line signal by receiving the control signals PEQB and DEQB. These signals are input into the negative voltage generator 504 generating negative voltage or ground voltage level.

Referring again to FIG. 4, the negative voltage generator 300 includes a first NAND gate 465 which receives the three control signals, i.e., PEQB, DEQB and PWL, and a second NAND gate 470 which receives the inverted output of the first NAND gate 465 through an inverter 466 and the delayed and inverted output of the first NAND gate 465 through inverters 467 and 468. Also, the negative voltage generator 300 includes a buffer 472 for buffering the output of the second NAND gate 470, a capacitor 421 which is made up of a PMOS transistor and coupled to the buffer 472, and an NMOS transistor 412 coupled between the output terminal and a ground voltage level. The NMOS transistor 412 discharges the voltage on the output terminal. Further, the negative voltage generator 300 includes a diode-coupled PMOS transistor 423 coupled between the output terminal and the ground voltage level, in order that the voltage level at the output terminal and its threshold voltage are the same at the initial state in which power is applied to the SRAM cell. The negative voltage generator 300 also includes an NOMS transistor 411 coupled to the output terminal and a PMOS transistor 422 coupled to a power supply. The gates of the NOMS transistor 411 and the PMOS transistor 422 are coupled to the output of the inverter 468. The drain of the PMOS transistor 422 and the source of the MOS transistor 411 are coupled to the gate of the NMOS transistor 412.

In other words, the MOS transistors 411, 412 and 422 act as a ground voltage generating means for discharging the output terminal up to the ground voltage level in response to the control signals PEQB, DEQB and PWL. Meanwhile, it should be noted that the capacitor 421 is used as a negative charge pump for keeping the output terminal, which has been in the ground voltage level, being in a negative voltage level, in response to the same control signals PEQB, DEQB and PWL.

As mentioned above, at the initial state, the voltage level at the output terminal is kept being the same as its threshold voltage by the diode-coupled PMOS transistor 423 coupled between the output terminal and the ground voltage level. Also, in the case where one of the control signals PEQB, DEQB and PWL is in a low voltage level, the output of the NAND gate 465 is in a high voltage level. When the output of the NAND gate 465 is in a high voltage level, the NMOS transistor 411 is turned off and the PMOS transistor 422 is turned on. As a result, the NMOS transistor 412 is turned on, then the voltage level of the output terminal becomes the ground voltage level. On the other hand, in the case where all the control signals PEQB, DEQB and PWL is in a high voltage level, the NMOS transistor 412 is turned off, the output of the buffer 472 goes from a high logic state to a low logic state, and then the output terminal, which is coupled to the capacitor 42, is in the negative voltage level. At this time, the PMOS transistor 423, which is coupled between the output terminal and the ground voltage level, prevents the output voltage at the output terminal from being in an over-dropped negative voltage level. Accordingly, the negative voltage at the output terminal is limited to −Vtp (threshold voltage of the PMOS transistor).

When all the control signals PEQB, DEQB and PWL are in a high voltage level, that is, when the word line is enabled at the read cycle, the output terminal, which is coupled to the source of the drive transistor in the SRAM cell, is in a negative voltage level; otherwise, the output terminal is in a ground voltage level.

Figure 6A:
FIG. 6A is a timing chart of the negative voltage generator when address transition is achieved.
Figure 6B:
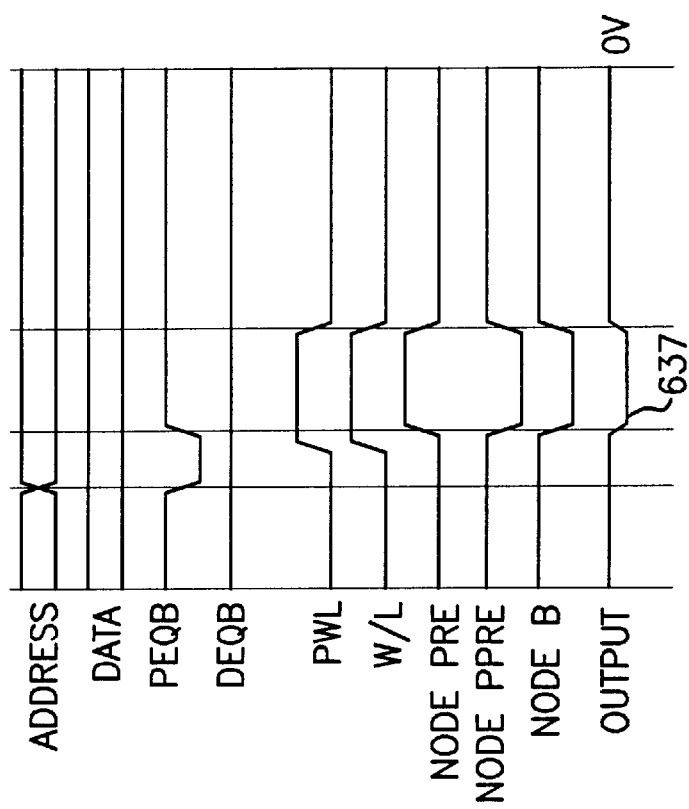
FIG. 6B is a timing chart of the negative voltage generator when address and data transitions are achieved.

FIG. 6A and 6B are timing charts of the negative voltage generator. As shown in FIG. 6A, if the address is only changed and the data is fixed, the control signal DEQB is kept in a high voltage level and the negative voltage is generated through the paths shown in FIGS. 4 and 5 (reference numeral 637). In similar, if both the addresses and the data are changed, the negative voltage is generated through the paths shown in FIGS. 4 and 5 (see reference numeral 637).

Figure 7:
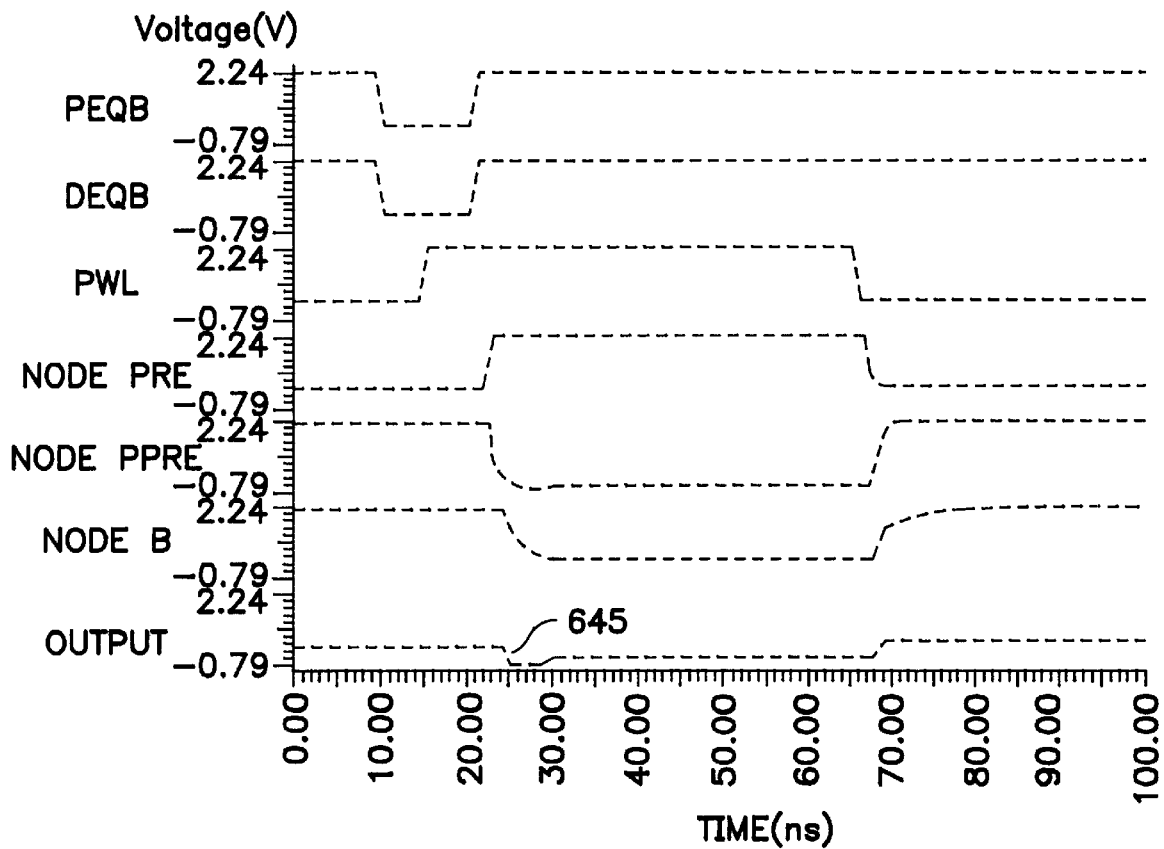
FIGS. 7 and 8 are plots illustrating the transient voltage analysis of the negative voltage generator.
Figure 8:
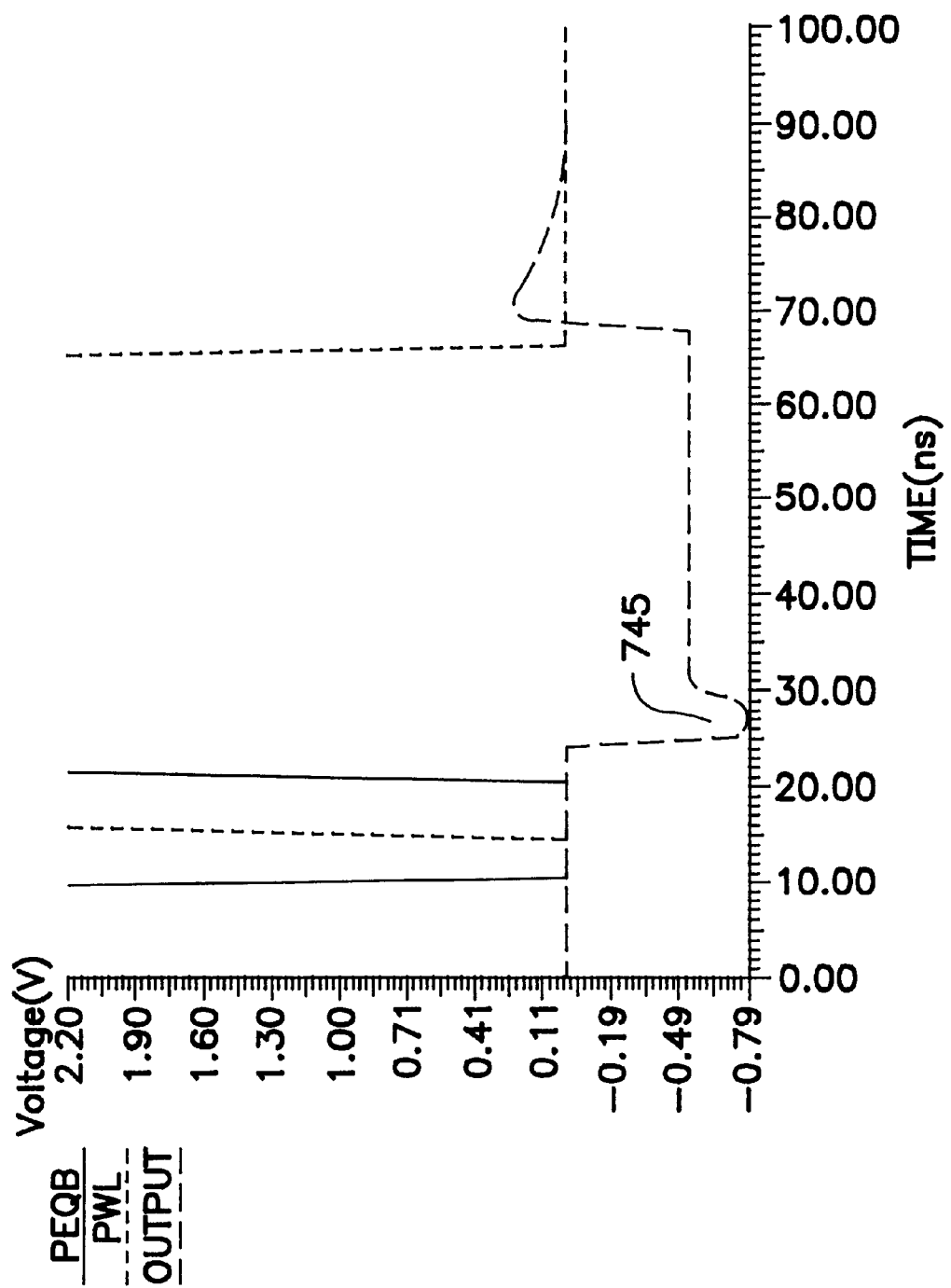

FIGS. 7 and 8 are plots illustrating the transient voltage analysis of the negative voltage generator, where there are shown a voltage level when the negative voltage is generated (see reference numerals 645 and 745).

Figure 9:
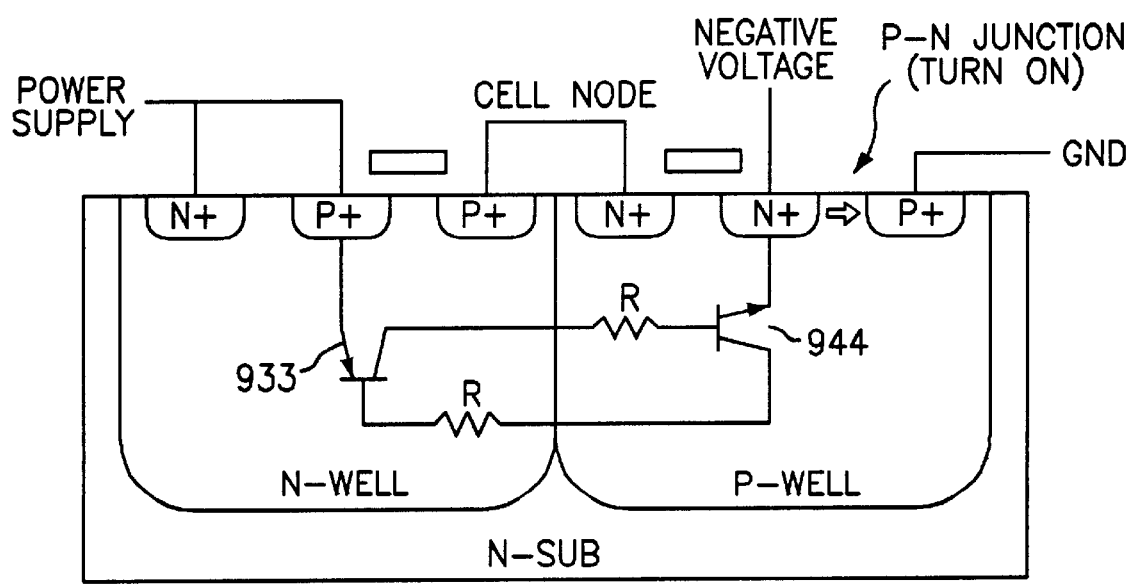
FIG. 9 is a cross-sectional view illustrating a latch-up in the SRAM of FIG. 3.

FIG. 9 shows a cross-sectional view illustrating a latch-up problem in the SRAM of FIG. 3. As shown in FIG. 9, if only the sources of the drive transistors 301 and 302 are derived to decrease the potential at the cell nodes N1 and N2 in FIG. 3, the latch-up is induced by a parasite PNP BJT (Bipolar Junction Transistor) 933 and NPN BJT 944 because the forward-bias is applied to the junction which is made up of the source and p-type substrate.

Figure 10:
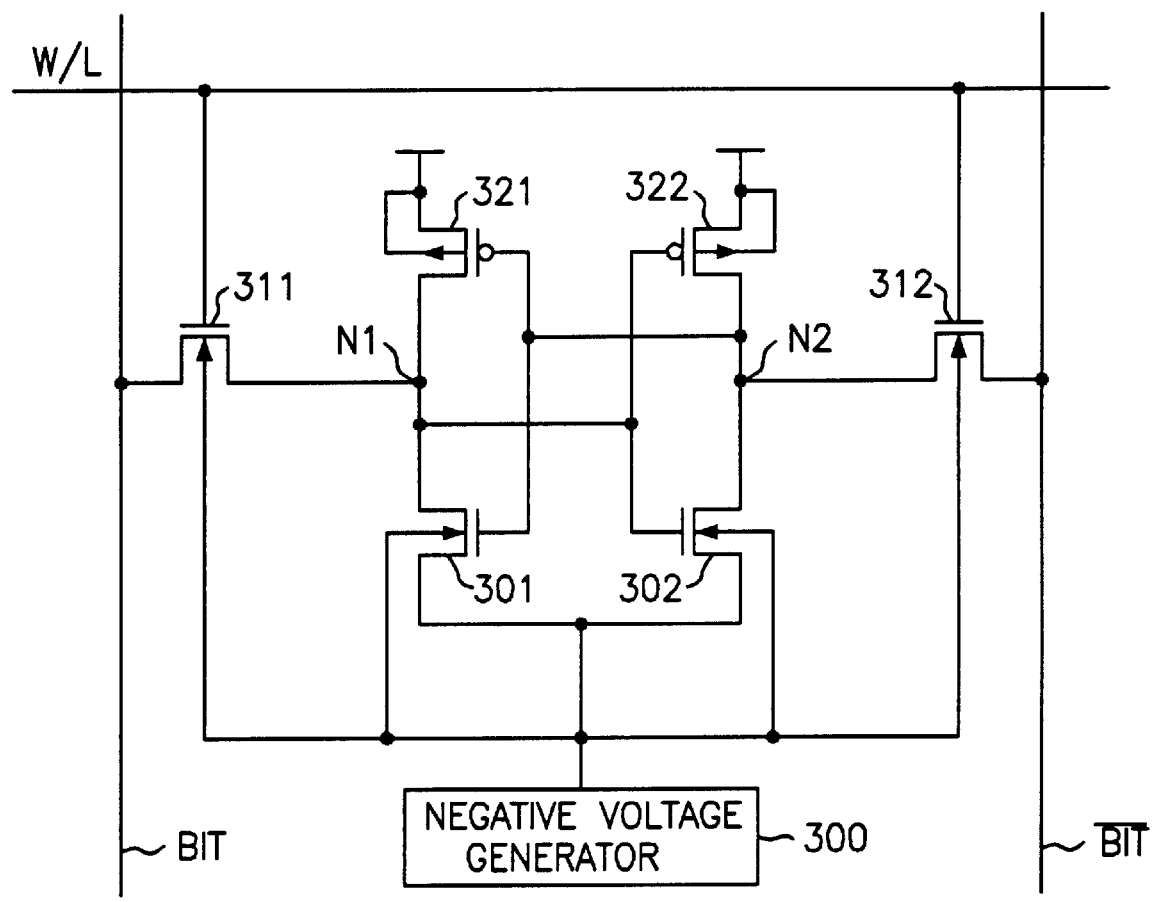
FIG. 10 is a circuit diagram illustrating a SRAM cell in accordance with another embodiment of the present invention.

Accordingly, in another embodiment of the present invention, both the access transistors and the driver transistors are also derived in the negative or ground voltage level. As shown in FIG. 10, the p-type substrates, which the access transistors 311 and 312 and the drive transistors 301 and 302 are formed on, are connected to the negative voltage generator 300 together with the sources of the drive transistors 301 and 302. Then, when the SRAM is at the read cycle and the word line is activated, the access transistors 311 and 312 and the driver transistors 301 and 302 are derived in the negative voltage level together with the sources of the drive transistors 301 and 302.

Figure 2A:
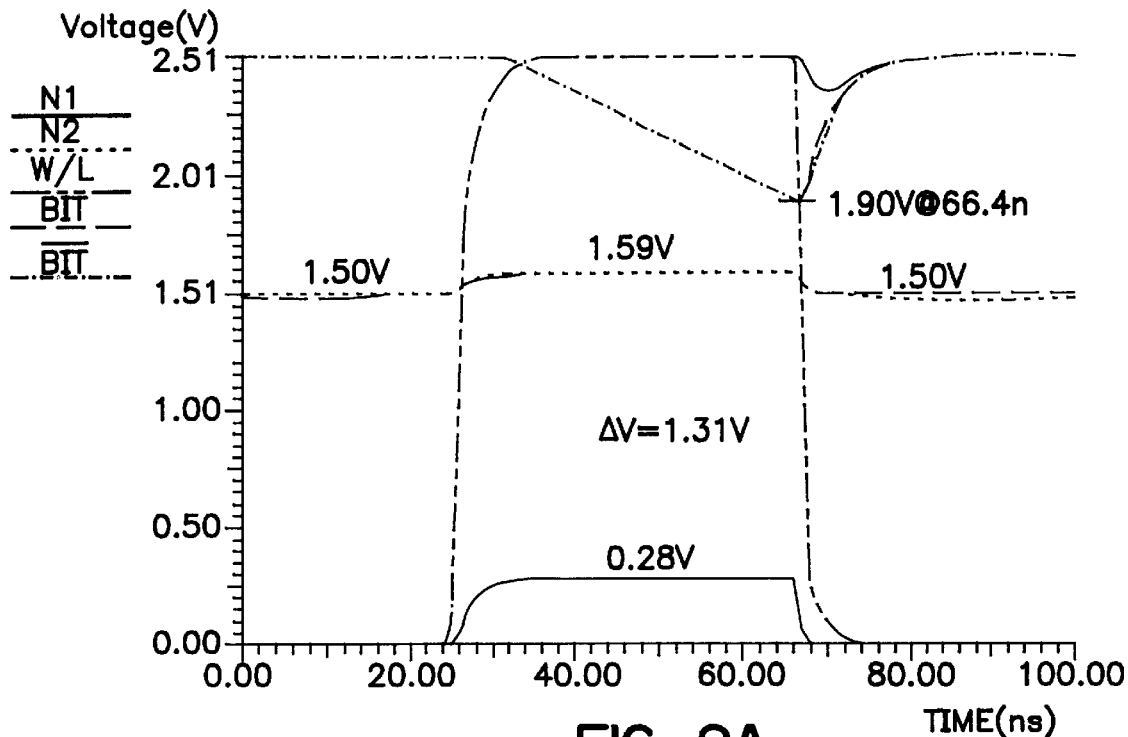
FIGS. 2A and 2B are plots illustrating the transient voltage analysis in the SRAM of FIG. 1.
Figure 2B:
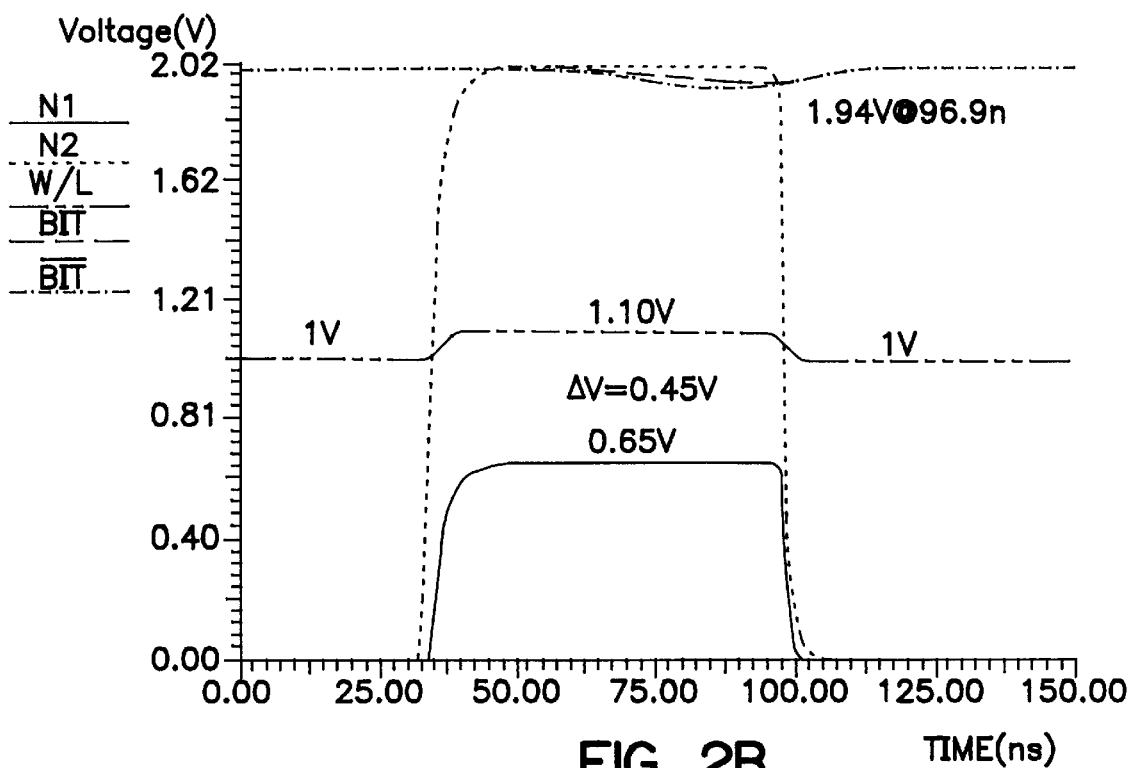
Figure 11A:
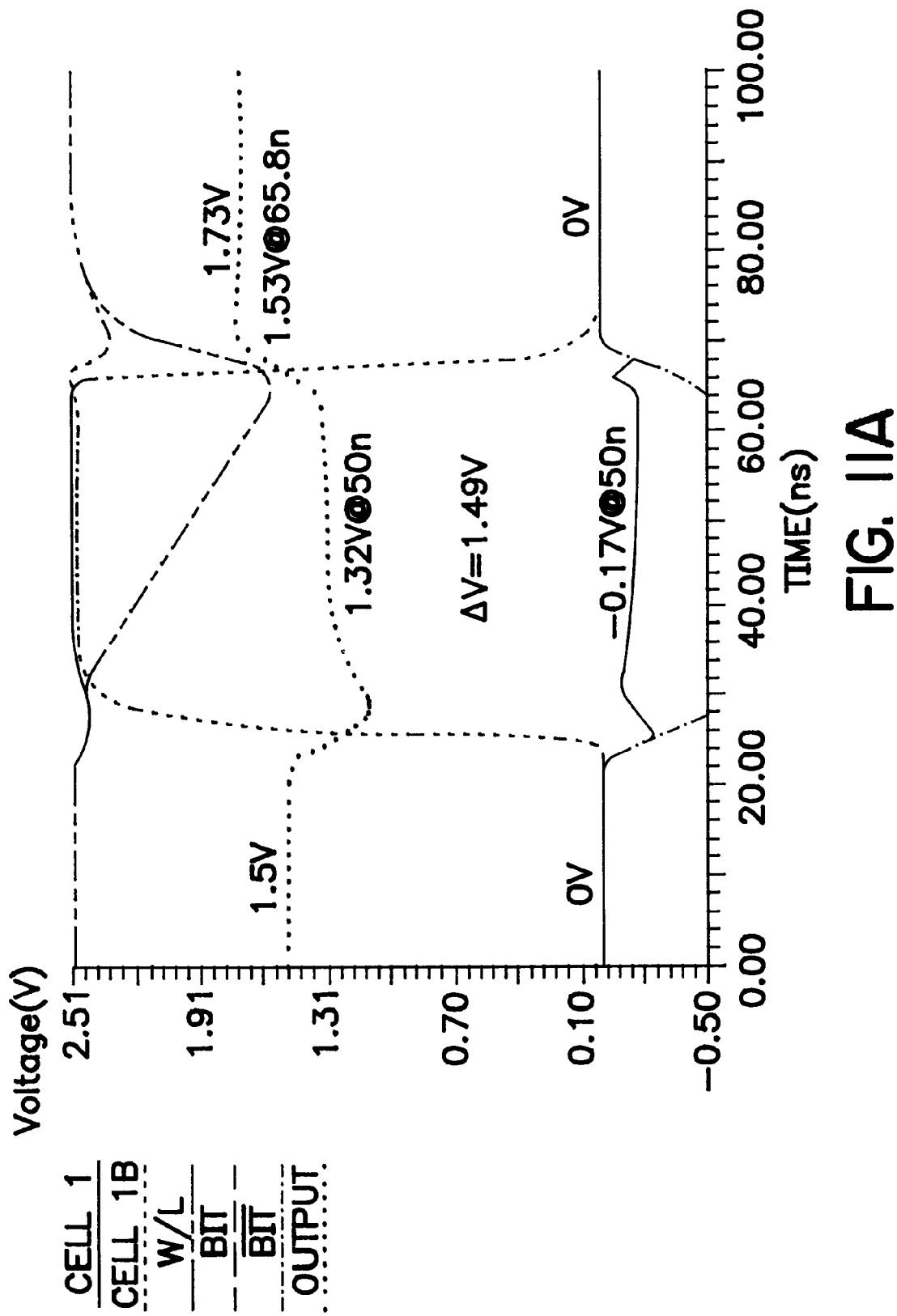
FIGS. 11A and 11B are plots illustrating the transient voltage analysis of the negative voltage generator of FIG. 10.
Figure 11B:
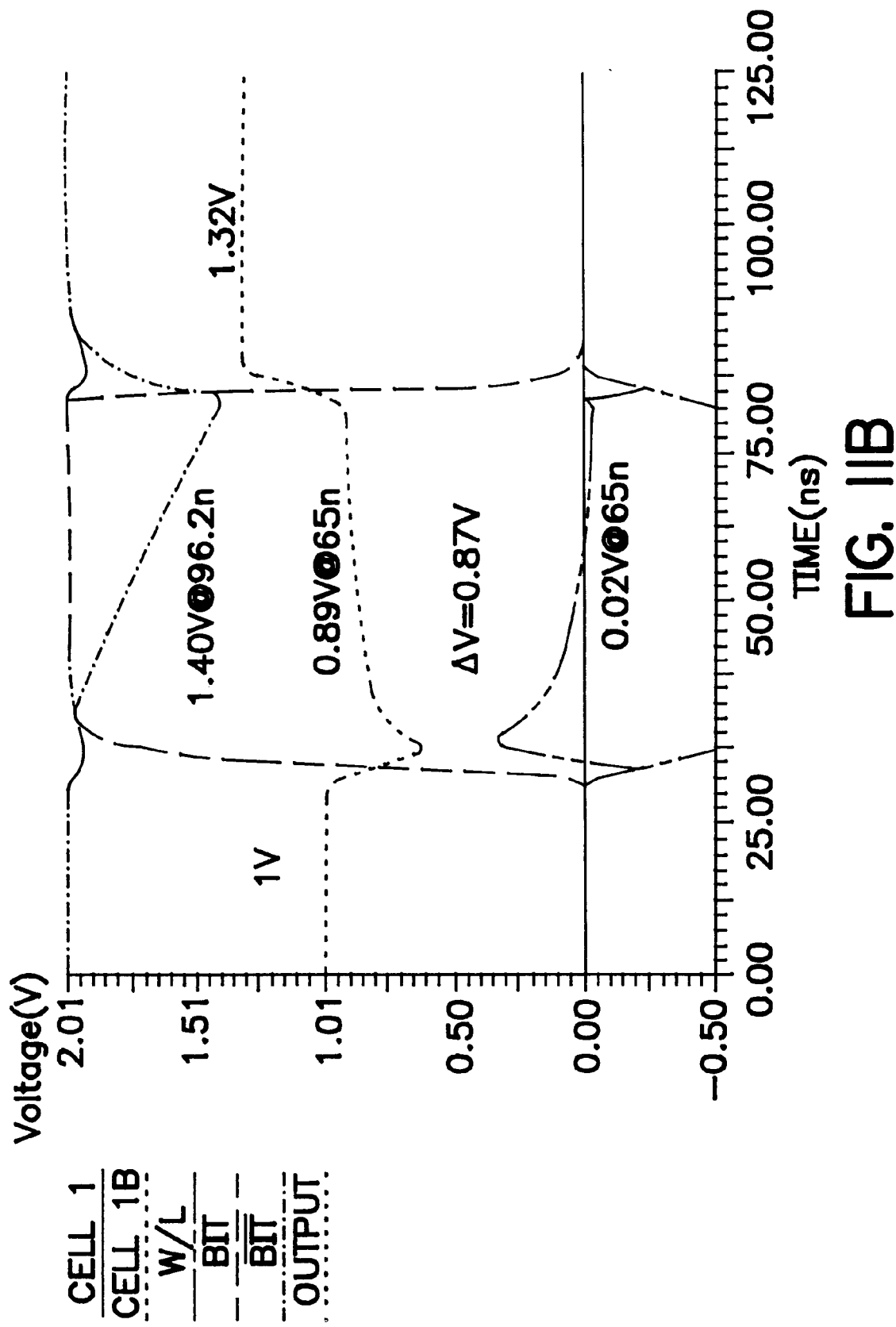

FIGS. 11A and 11B are plots illustrating the transient voltage analysis of the negative voltage generator of FIG. 10. Referring to FIGS. 11A and 11B, the voltage difference between the cell nodes N1 and N2 for the read cycle is about 1.49 V at the power supply of 2.5 V and is about 0.6 V at the power supply of 2 V. Compared with the transient voltage analysis in the SRAM of FIGS. 2A and 2B, the transient voltage analysis according to the present invention shows improved electric characteristics. In the present invention, the voltage difference between the cell nodes N1 and N2 for the read cycle is improved by 0.18 V (1.49 V−1.31 V) at the power supply of 2.5 V and by 0.42 V (0.87 V–0.45 V) at the power supply of 2 V. Further, the voltage difference between the bit lines for the read cycle is increased up to 0.37 V (0.97V–0.6 V) at the power supply of 2.5 V and up to 0.54V (0.6 V–0.06V) at the power supply of 2 V.

As apparent from the above, the SRAM cell according to the present invention performs stable data latch operation in low power supply, by applying negative voltage to the sources of the drive transistors.

What is claimed is:

1. A SRAM device including access transistors and drive transistors, comprising:

a negative voltage generator coupled to the drive transistors for providing negative voltage for the drive transistors during a read cycle of the SRAM device, wherein a word line of the SRAM device is activated for the read cycle, wherein a control signal configured to control said negative voltage generator includes an address transition detecting signal, a data transition detecting signal and a pulsed word line signal which is produced by the address transition detecting signal and the data transition detecting signal.

2. The SRAM device in accordance with claim 1, wherein the negative voltage generator comprises:

an output terminal coupled to the drive transistors;

a first means for discharging the output terminal up to a ground voltage level in response to control signals; and a second means for pumping the output terminal, making the output terminal be in a negative voltage level.

3. The SRAM device in accordance with claim 2, wherein the negative voltage generator further comprises a diode-coupled MOS transistor coupled to the output terminal for preventing potential of the output terminal from being dropped down a voltage lower than threshold voltage thereof.

4. The SRAM device in accordance with claim 1, wherein the negative voltage generator comprises a logic circuit for providing negative voltage for the drive transistors during a read cycle of the SRAM device, the logic circuit comprising:

a first NAND gate receiving the control signals;

a second NAND gate receiving an inverted output signal of the first NAND gate and a delayed signal of the inverted output signal; and a buffering means for delaying the output signal of the second NAND gate.

5. The SRAM device in accordance with claim 2, wherein the first means comprises:

a current path transistor coupled to the output terminal;

an NMOS transistor coupled between the output terminal and a gate of the current path transistor, wherein the NMOS transistor is turned on in response to a delayed signal of the inverted output signal; and a PMOS transistor between a power supply and the gate of the current path transistor, wherein the PMOS transistor is turned on in response to the delayed signal of the inverted output signal.

6. A SRAM device including access transistors and drive transistors, comprising:

a negative voltage generator coupled to sources of the drive transistors, to wells on which the drive transistors are formed, for providing negative voltage for the sources of the drive transistors and the wells during a read cycle of the SRAM device when a word line of the SRAM device is activated.

7. The SRAM device in accordance with claim 6, wherein the negative voltage generator comprises:

an output terminal coupled to the drive transistors;

a first means for discharging the output terminal up to a ground voltage level in response to control signals; and a second means for pumping the output terminal, making the output terminal be in a negative voltage level.

8. The SRAM device in accordance with claim 7, wherein the control signal are an address transition detecting signal, a data transition detecting signal and a pulsed word line signal which are produced by the address transition detecting signal and the data transition detecting signal.

9. The SRAM device in accordance with claim 7, wherein the negative voltage generator further comprises a diode-coupled MOS transistor coupled to the output terminal for preventing potential of the output terminal from being dropped down a voltage lower than threshold voltage thereof.

10. The SRAM device in accordance with claim 6, wherein the negative voltage generator comprises a logic circuit for providing negative voltage for the drive transistors during a read cycle of the SRAM device, the logic circuit comprising:

a first NAND gate receiving the control signals;

a second NAND gate receiving an inverted output signal of the first NAND gate and a delayed signal of the inverted output signal; and a buffering means for delaying the output signal of the second NAND gate.

11. The SRAM device in accordance with claim 7, wherein the first means comprises:

a current path transistor coupled to the output terminal;

an NMOS transistor coupled between the output terminal and gate of the current path transistor, wherein the NMOS transistor is turned on in response to a delayed signal of the inverted output signal; and a PMOS transistor between a power supply and gate of the current path transistor, wherein the PMOS transistor is turned on in response to the delayed signal of the inverted output signal.

* * * * *